(12) United States Patent
Cohen et al.

(10) Patent No.: US 6,424,417 B1
(45) Date of Patent: Jul. 23, 2002

(54) METHOD AND SYSTEM FOR CONTROLLING THE PHOTOLITHOGRAPHY PROCESS

(75) Inventors: Yoel Cohen, Ness-Ziona; Moshe Finarov, Rehovot, both of (IL)

(73) Assignee: Nova Measuring Instruments Ltd., Rehovot (IL)

(*) Notice: Subject to any disclaimer, the term of this patent is extended or adjusted under 35 U.S.C. 154(b) by 0 days.

(21) Appl. No.: 09/206,282

(22) Filed: Dec. 7, 1998

(30) Foreign Application Priority Data

Jun. 14, 1998 (IL) .................................................. 125338

(51) Int. Cl.[7] .............................................. G01B 11/00
(52) U.S. Cl. ..................... 356/388; 356/394; 250/491.1
(58) Field of Search ................................ 356/394, 388; 250/491.1

(56) References Cited

U.S. PATENT DOCUMENTS

| | | | |
|---|---|---|---|
| 4,430,571 A | * 2/1984 | Smith et al. | 250/492.2 |
| 4,474,864 A | 10/1984 | Chow et al. | |
| 5,124,927 A | * 6/1992 | Hopewell et al. | 356/394 |
| 5,517,312 A | 5/1996 | Finarov | |
| 5,620,818 A | 4/1997 | Yuan | |
| 5,635,285 A | 6/1997 | Bakeman, Jr. et al. | |
| 5,692,070 A | * 11/1997 | Kobayashi | 382/145 |

FOREIGN PATENT DOCUMENTS

| | | |
|---|---|---|
| EP | 0 313 013 | 4/1989 |
| EP | 0 656 565 | 6/1995 |
| EP | 0 727 715 | 8/1996 |

* cited by examiner

Primary Examiner—Frank G. Font
Assistant Examiner—Roy M. Punnoose
(74) Attorney, Agent, or Firm—Browdy and Neimark

(57) ABSTRACT

A method and a system are presented for automatic optical control of at least one working parameter of a processing tool to be applied to a working area of a workpiece for providing certain process results. The at least one working parameter of the processing tool affects at least one parameter of the workpiece under processing. The processing tool has a preset value of the at least one working parameter prior to the processing of the workpiece. A measuring tool is applied to the workpiece prior to its processing by the processing tool for measuring the at least one parameter of the workpiece and generating measured data representative thereof. The measured data is analyzed with respect to the preset value of the working parameter and to the process results, so as to determine whether the preset value should be corrected for providing the certain process results when applying the processing tool to said workpiece. Upon detecting that the preset value should be corrected, calculating a correction value.

20 Claims, 11 Drawing Sheets

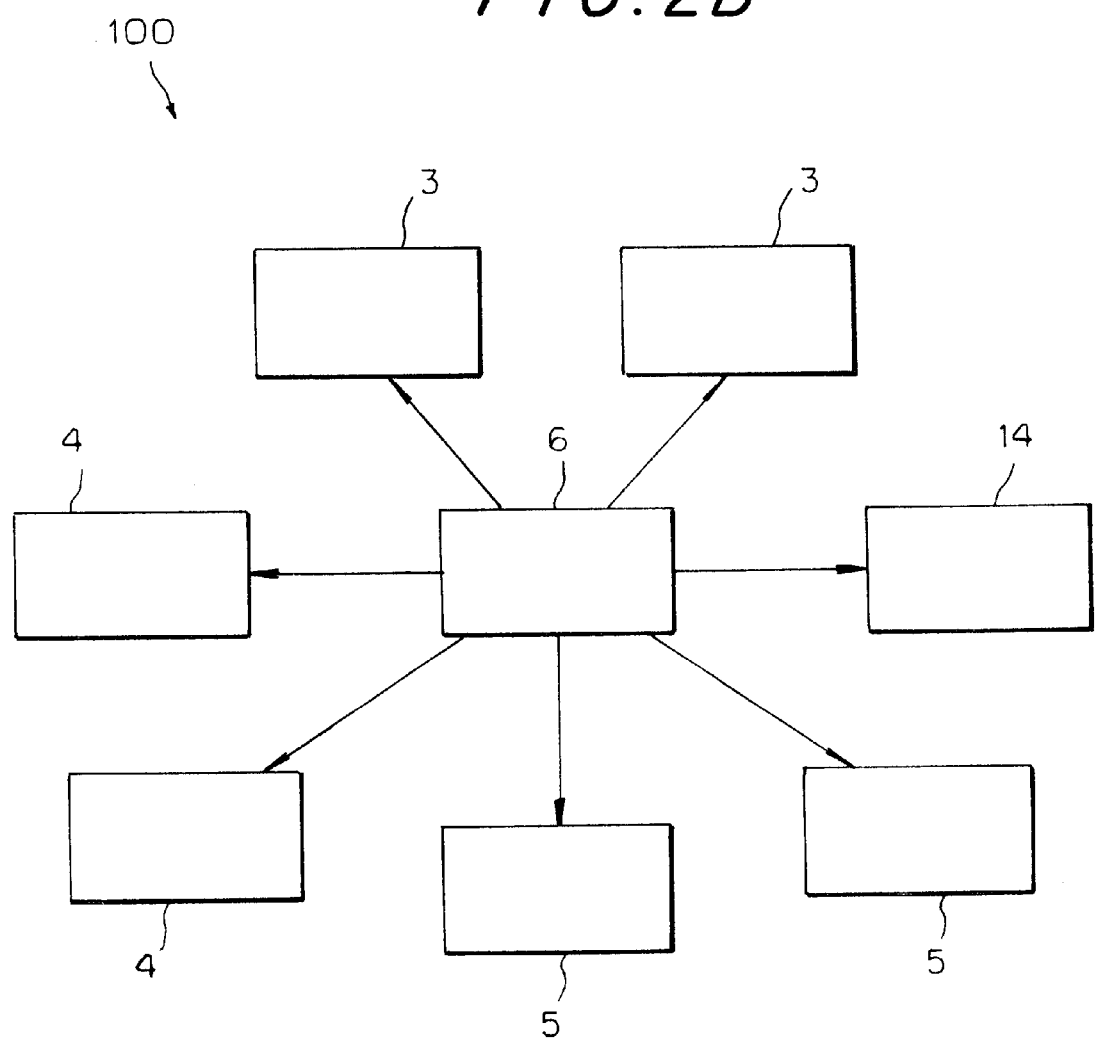

METHOD AND SYSTEM FOR CONTROLLING THE PHOTOLITHOGRAPHY PROCESS

FIELD OF THE INVENTION

The present invention is in the field of measuring/inspecting techniques and relates to a method and a system for controlling the operation of a processing toot for processing workpieces. The invention is particularly useful in the manufacturing of semiconductor devices to control the operation of photolithography tools to optimize the entire photolithography process.

BACKGROUND OF THE INVENTION

The manufacture of semiconductor devices consists of several procedures applied to a semiconductor wafer to define active and passive elements. The wafer is prepared and one or n)ore layers are deposited thereon. Thereafter, the process of photolithography is performed in which the surface of a wafer with a pattern conforming to circuit elements is formed. An etching process applied to the uppermost layer follows the photolithography, By desirably repeating these processes, a multi-level semiconductor wafer is produced. Thus, photolithography is one of the main steps in the manufacture of semiconductor devices. It actually consists of the optical image transfer of a pattern form a mask to a semiconductor wafer.

It is a common goal of the semiconductor industry to minimize features on, a wafer, namely to make the pattern finer and finer. Owing to the fact that optical systems used for image transfer reach their limitations. die lithography process should meet higher requirements of its operational performance. This means finer process control, as well as the development of new lithography equipment and chemicals. The major steps of the photolithography process are as follows:

(a) coating a wafer with a photoresist material (PR);
  (b) exposing the PR to UV radiation through a mask in order to produce a latent image of the mask on the PR;
  (c) developing the exposed FR in order to produce the image; and
  (d) measuring and inspecting the wafer.

During the exposure of PR to UV light the PR becomes more or less soluble in a developing solvent, as compared to the exposed PR, thereby producing a positive or a negative tune image, respectively.

FIG. 1 illustrates a common photolithography tools arrangement, a so-called, "link arrangement", generally designated 1, for carrying out the photolithography process. The main idea underlying the implementation of such a link arrangement is that each tool is dedicated to serve the next one in the series, so as to minimize process/tool variations. The link arrangement 1 is composed of two main parts: a phototrack 2 and an exposure tool 3. The phototrack 2 is formed by a coater track 4 and a developer track 5, associated with cassette load/unload stations, designated 4a and 5a, respectively. A robot (not shown) loads the wafer from the cassette station 4a to the coater track 4, arid, when the coating procedure is complete, transfers it to the exposure tool 3. Here, the pattern on a mask is aligned with a structure already on the wafer (registration) by an optical means installed inside the exposure tool 3, and the wafer is exposed to electromagnetic radiation through the mask. After exposure, the robot transfers the wafer to the developer track 5 and then to the cassette station 5a. Additionally, several different baking procedures are implemented during the steps (a)–(C). The coater track 2, exposure tool 3 and developer track 5 eve tightly joined together in order to minimize process variability and any potential risk of contamination during photolithography which is a very sensitive process.

The measurement/inspection step is carried out with a metrology tool 7, which is typically a big, stand-alone machine, that serves for the serial critical dimensions (CD) measurement. CD metrology tool 7 measures the width of representative lines, spaces and line/space pairs on the wafer. The operation of a conventional CD metrology tool is based on two main methods: scanning electron microscope (CD SEM) and atomic forced microscope (CD AFM). CD measurements typically talk place after the developing step. To this end, "developed" wafers are taken out of the link arrangement 1 and transferred to the separate CD station occupied by the tool 7. Data obtained during the CD measurements is analyzed with a processor 8 (which is typically integral with the CD metrology tool), and then a some sort of feedback is provided (e.g. an alarm in case of a width out of the permitted range) and transmitted to a relevant unit in the production line.

The quality of the entire photolithography process is defined by a combination of tolerances for all relevant parameters that can influence the final image transfer. The main parameter that should be controlled (and the easier to be adjusted and compensated) is the exposure dosage, i.e. the amount of energy reaching the PR.

According to one known technique, so-called "send ahead wafer", a pilot wafer is sent through the arrangement 1, namely through the coating-exposure-developing steps, applying a certain recommended exposure dose (and time), and then undergoes CD measurements. The results of the measurements will be the basis for set-up conditions of the entire lot, or for a correction signal to be applied to the tool 3 prior to the exposure of another wafer in the lot, i.e. a feedback loop. The whole sequence of such a "send ahead wafer" procedure can take many hours, during which valuable time of the production tools is not fully utilized and the wafers' flow is delayed. According to another technique, each lot is the basis for the next lot to run in this process representing a so-called "lot-to-lot control". By considering the results of the previous lot, a small correction can be made. However, a certain increment in the risk exists, because the entire lot may be lost. Both of these techniques are time, labor and materials consuming and usually do not reveal any problematic root.

It is known that the photolithography provides sufficient results at certain levels of PR bleaching. Unfortunately, owing to the fluctuations of scan speed and light intensity, it is very difficult to reproduce each time the optimum exposure dose.

The most popular method used in production for providing a measurement directly correlated with the photoresist lithography image is a so-called "optimal exposure test". According to this method, a wafer coated with a photoresist material is exposed through a mask using a sequence of different dosages. Following the exposure and development steps, the dose is estimated as a function of line width, utilizing the electron microscopy technique. Notwithstanding that this method considers all the relevant operations and materials of the entire photolithography process (i.e. coat, expose, develop, bakes, resist. etc.), it consumes expensive useful time of the exposure equipment.

U.S. Pat. No. 5,620,818 discloses a photolithographic dose determination technique, which utilizes diffraction of a latent image grating for constructing a calibration curve. This technique is not compatible with on-line production control, because of the following features. It requires that a special mask be designed and a special test wafer, having all the relevant stack layers, be created. A large area of a test structure is needed to provide a sufficient signal-to-noise ratio. Additionally, to consider each layer and each resist when constructing the calibration curve, a sequence of gradual exposures of the mask on the wafer should be conducted.

U.S. Pat. No. 5,635,285 discloses several methods of determining the correction for exposure. One of them is based on an exposure with a phase shift mask, which suffers from the need of an additional alignment procedure. Another method uses the known FLEX technique for exposures in several focus conditions to overcome the limits of depth of focus (DOF). This method has alignment and magnification error related problems. Yet another method is based on the use of an additional "out of focus illumination". More specifically, additional radiation is added outside the depth of focus and the mask operates as a gray scale regime. Consequently, the method is "mask regime dependent", and therefore should be applied for each mask area, each layer and each product separately.

U.S. Pat. No. 4,474,864 discloses a method for dose calculation presenting an initial calculation procedure that relates to the construction of calibration curves for the first exposure set up. This calibration is implemented by the coating and gradual exposure of a few transparent wafers for measuring the absorption resulting from bleaching at a certain single wavelength. However, the method suits a laboratory measurement procedure and not a real time process control since it is time consuming, and requires a long preparation procedure. This method does not consider any simultaneous measurement of thickness and refractive index (only absorption) which may vary during exposure, thereby affecting the absorption. Moreover, this method is based on the assumption that the reflection is negligible, which may actually yield an error. According to this patent disclosure, the deduction of a calibration curve is based on a single wavelength. This indicates that the measurement values have no statistical averaging that can decrease the error of the measurement itself.

In view of the above, it is evident that existing techniques for exposure dose determination/correction cannot be used as on-line manufacturing steps, and fail to provide high accuracy and automatic analysis and "feed-forward" dose control, rather than "feed-back". The existing methods lead to the waste of wafers and other materials like photoresist and solvents, as well as the waste of costly/useful time of the photolithographic tool. Hence, they reduce the production rate (i.e. throughput) of the lithographic tools. Additionally, current methods do not allow for accurate and fast determination of the optical parameters of the PR layer, such as an absorption coefficient k and a refraction index n, and therefore do not allow for the direct dosage correction.

SUMMARY OF THE INVENTION

There is accordingly a need in the art to improve the quality of a photolithography process used in the manufacture of semiconductor devices by providing a novel measuring method and system.

It is a major object of the present invention to provide such a method and a system that can be used for controlling parameters of the photolithography tools in production.

There is provided, according to one aspect of the invention, a method for automatic optical control of at least one working parameter of a processing tool to be applied to a working area of a workpiece for providing certain process results, said at least one working parameter of the processing tool affecting at least one parameter of the workpiece under processing, wherein the processing tool has a preset value of said at least one working parameter prior to the processing of the workpiece, the method comprising the steps of:

(a) providing a measuring tool to be applied to the workpiece prior to its processing by the processing tool;

(b) applying the measuring tool to the workpiece for:

(c) measuring said at least one parameter of the workpiece and generating measured data representative thereof;

(d) analyzing said measured data with respect to said preset value of the working parameter and to said process results and determining whether said preset value should be corrected for providing said certain process results when applying the processing tool to said workpiece; and (e) upon detecting that said preset value should be corrected, calculating a correction value and generating data representative thereof.

The main idea of the present invention consists of the following. A workpiece progressing along a production line is to be processed by a processing tool. The working parameter of the processing tool is typically tuned to a preset value. During the processing of the workpiece with the processing tool, the value of this working parameter affects some parameters of the workpiece. The processing is expected to provide certain desired values of these workpieces' parameters (constituting the process results). However, owing to the fact the various procedures were applied to the workpiece before it arrives to the processing tool (which is usually the case considering such a workpiece as a semiconductor wafer progressing on the production line), these procedures may unpredictably influence on the parameters of the workpiece. Consequently, the preset value of the working parameter needs to be corrected so as to meet the requirements of the real before-processing conditions of the specific workpiece and to satisfy the process results. For the purpose, a novel controlling method is proposed. The method consists of measuring the workpiece's parameters before the processing, and analyzing the same, as well as the preset value of the working parameter and the process results, to determine a correction value to be applied to the preset value for achieving the process results when applying the processing tool to die measured workpiece. This technique of measuring the operational workpiece before its processing and adjusting the processing tool parameter accordingly represents a feed forward closed loop.

Certain reference data provided and used for performing the measurements and analysis of the measured data. The reference data is representative of at least one calibration curve in the form, of the at least one parameter of the workpieces as a function of the at least one working parameter of the processing tool. The reference data also comprises an optical model based on nominal values of certain features of the workpiece for obtaining theoretical data representative of the at least one parameter of the workpiece. The optical model presents theoretical data (mathematical equation) in the form of the intensity radiation as a function of wavelength, wherein the radiation is that returned (reflected) from an illuminated area of the workpiece. The reflected radiation depends on the required parameters of the workpiece in accordance with known physical effects relevant to the specific known kind of workpieces.

If the workpiece to be processed follows a preceding (already processed) workpiece of the same group, (e.g. one or more lot or batches in the case of wafers) the calibration curves are known (already obtained). When dealing with a "new" group of workpieces of the known kind, the calibration curves are prepared with respect to a first-coming workpiece in the group. In order to prepare the at least one calibration curve, a so-called "set-up operations stage" should be performed. This stage consists of applying a desired number of "test cycles" to the operational workpiece within a "test area" thereof. Such a workpiece as wafer is typically formed with a test area located out of the working (patterned) area and having features similar to the features of the working area.

The test cycle consists of before-process measurement, test process and after-process measurement steps, sequentially applied to the test area and being carried out by the measuring tool located as described above. To this end, the measuring tool is adapted for processing the workpiece similar to the processing tool, a ratio between the working parameters of the measuring and processing tools being of a predetermined value. The desired number of such test cycles are performed by small movements to corresponding number of test sites (portions) within the test area using different values of the working parameter of the measuring tool for each cycles and each time determining the values of the required parameters of the workpiece.

From the calibration curve a recommended value of the working parameter can be determined. It should be noted that the recommended value might be given by a manufacturer. In this case, the calibration curve serves for determining whether this given value satisfies the process results, and, upon detecting that it does not satisfy the process results, for calculating the correction value to be applied to the recommended value. Additionally, during the preparation of the calibration curves, the nominal values of some features of the workpiece could be updated and the optical model so optimized could be further used for measurements.

Each measurement is performed by illuminating at least a portion (test site) within the test area by a predetermined incident radiation spectrum and detecting radiation returned (reflected) from the illuminated area. Measured data so obtained is in the form of the radiation intensity as a function of wavelength. Using a fitting procedure between the measured and theoretical data, the required parameters can be determined and analyzed to generate data representative of the correction value. This data may be "fed forward" to the processing tool to adjust the value of its working parameter for obtaining the process results for this specific measured workpiece.

Preferably, the workpieces are wafers, the production line being a conventional photolithography arrangement. The working area of the wafer is an area, which is formed or is to be formed with a desired pattern. The processing tool to be controlled is, preferably. an exposure tool, the working parameter to be connected being the exposure dose. However, in general, the processing tool may be any one of those used in the photolithography arrangement (i.e. coater, developer, etc.). The at least one measured parameter of the workpiece is the wafer's reflectivity (i.e. reflectivity of either a substrate or a photoresist layer on the substrate), PR refraction index, absorption coefficient or thickness.

Thus, according to another aspect of the present invention there is provided a method for automatic optical control of at least one working parameter of a processing too to be applied to a working area of a workpiece for providing certain process results, wherein said processing tool is a part of a photolithography tools arrangement, said at least one working parameter of the processing tool afffects at least one parameter of the workpiece under processing, the processing tool has a preset value of said at least one working parameter prior to the processing, the method comprising the steps of:

providing a measuring tool to be applied to said workpiece prior to its processing by the processing tool;

applying the measuring tool to said wafer for:

measuring said at least one parameter of the wafer and generating measured data representative thereof;

analyzing said measured data with respect to said preset value of the working parameter and to said process results for determining whether said preset value should be corrected for providing said process results when applying the processing tool to said wafer; and upon detecting that said preset value should be corrected, calculating a correction value and generating data representative thereof.

According to yet another aspect of the present invention, there is provided a measuring tool for an automatic optical control of at least one working parameter of a processing tool which is to be applied to a workpiece for processing a working area thereof for providing certain process results, said working parameter affecting at least one parameter of the workpiece under processing, wherein the processing tool has a preset value of said at least one working parameter prior to the processing, the tool comprising:

(1) a processing channel adapted for processing the workpiece similar to the processing of the processing tool, a ratio between the working parameter of the processing channel and processing tool being of a predetermined value;

(2) a measurement channel adapted for measuring said at least one parameter of the workpiece and generating measured data representative thereof;

(3) an actuator associated with said processing channel and said measuring channel for selectively actuating one of them; and (4) a processor coupled to said measurement channel, the processor being responsive to said measured data for determining and analyzing said at least one parameter of the workpiece, and calculating a correction value to be applied to the working parameter of the processing tool prior to the processing of the workpiece, so as to obtain said process results when applying the processing tool to said workpiece.

According to yet another aspect of the present invention, there is provided a production line having at least one processing tool adapted for processing successive workpieces progressing along the production line so as to provide certain process results, wherein said processing tool has a at least one working parameter thereof that affects at least one parameter of the workpiece under processing, the processing tool having a preset value of said at least one working parameter prior to the processing of said workpieces, the production line comprising a measuring tool installed so as to be applied to an operational workpiece prior to the processing thereof by the processing tool, the measuring tool being adapted for measuring said at least one parameter of the workpiece and determining whether said preset value should be corrected for providing the process results when applying the processing tool to said operational workpiece.

More specifically, the present invention is used with a photolithography tools arrangement for controlling the exposure tool parameter and is therefore described below with respect to this application.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIG. 2b is a block diagram of the main components of a system according to another embodiment of the invention;

DETAILED DESCRIPTION OF THE PRIOR ART AND PREFERRED EMBODIMENTS

Prior Art

Figure 1:
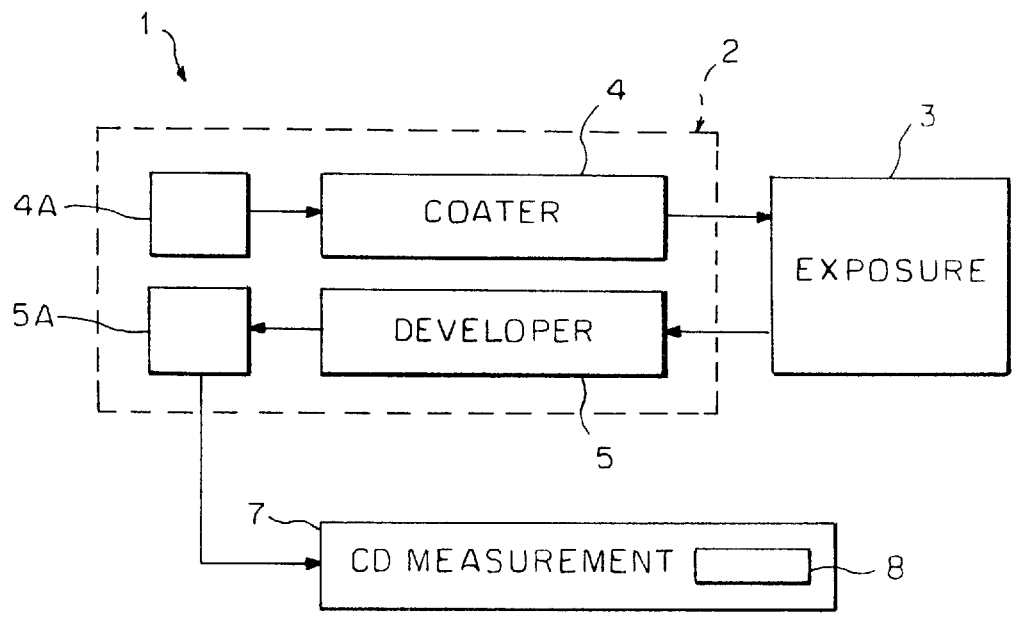
FIG. 1 is a block diagram of a common arrangement of the photolithography tools.

FIG. 1 illustrates a conventional photolithography tools arrangement with a wafer flow chart, generally designated 1, comprising coating, exposing and developing tools 4, 3 and 5, respectively, and a robot, which is not specifically shown in FIG. 1. The arrangement 1 is associated with the separate measurement/inspection station occupied by CD measurement tool 7 that is typically equipped by a suitable processor 8 to provide a manual feedback loop for controlling the process and tools parameters. The CD tool 7 is an expensive "stand alone" device which is typically manually loaded/unloaded.

Working Environment of the Present Invention
Link Arrangement

Figure 2A:
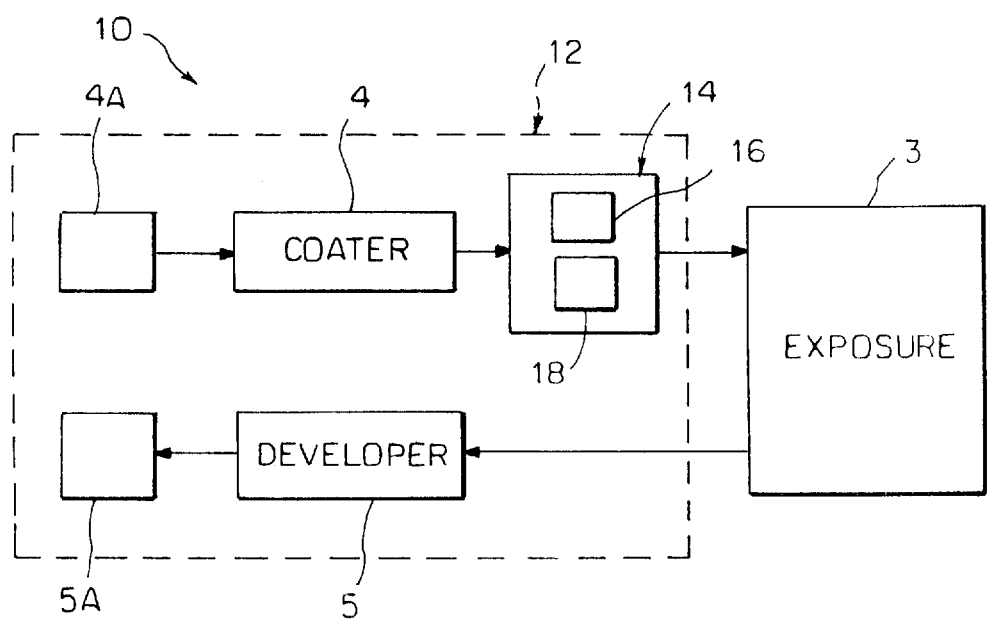
FIG. 2a is a block diagram of tile main components of a system according to one embodiment of the invention.

Referring to FIG. 2a, there is illustrated a system, generally designated 10, constructed and operated according to the present invention. The system 10 presents a photolithography link arrangement with a wafer flow chart generally similar to the conventional arrangement 1, but has some unique features consisting in the provision of a "feed forward" loop. Same reference numbers are used for identifying those components, which are identical in the arrangement 1 and system 10, so as to facilitate the understanding of the main concept of the invention. Thus, a phototrack 12 of the system 10, in addition to the coating, exposing and developing tools, comprises a measuring tool 14 associated with a control unit 16 and the operator's station 18. The control unit 16 is a processor equipped with a suitable image processing utility. The construction and operation of the station 18 do not form a part of the present invention and therefore need not be specifically described, except to note that the station 18 typically includes a personal computer equipped with a data base and a user interface.

Cluster Arrangement

FIG. 2b illustrates a system 100 which presents a photolithography arrangement, so-called "cluster tool", having a somewhat different construction in comparison to that of the link arrangement 10. Similarly, same reference numbers are used to indicate those components that are identical in the systems 10 and 100. Here, a robot 6 is illustrated that transmits each workpiece within the cluster tool 100. Thus, the system 100, in addition to the conventional cluster tool comprises the measuring tool 14.

The Concept of the Measuring Tool

The measuring tool 14 is installed in a manner to be applied to an operational workpiece prior to its arrival to the processing tool to be controlled, e.g. the exposure tool 3. According to the example of FIG. 2a, the measuring tool 14 is installed upstream of the exposure tool 3. In other words, a wafer (not shown) is brought to the measuring tool 14 (by a robot) after PR coating and baking procedures. The wafer, when arriving to the measuring tool 14, is in its ready-to-exposure position being coated by a certain PR layer. The wafer is on its way to the exposure tool 3, where it should be exposed to a certain dose $d_0$ of certain UV radiation wavelength $\lambda_0$. The dose and wavelength values $d_0$ and $\lambda_0$ are nominal, tuned ("known") parameters of the exposure tool 3. Further "known" parameters are the substrate reflectivity $R_{sub}$ and those of the PR layer to be obtained after the exposure procedure with the tool 3, i.e. of the PR layer on the processed wafer ensuing from the exposure tool 3 and progressing to the developer tool 5. The PR layer parameters are absorption coefficient k and refraction index n (optical parameters), and thickness h. Thus, the exposure tool 3 is prepared (tuned) for the exposure procedure (i.e. exposure dose $d_0$) to be applied to expected substrate material and PR layer (i.e. having certain expected optical parameters and thickness), so as to provide the desired, after-exposure values of the following parameters: the substrate reflectivity (i.e. underneath the PR layer) as a function of the wavelength of incident light, $R_{sub}(\lambda)$; $k(\lambda)$; $n(\lambda)$ and h. The desired values of these parameters constitute the expected process results.

However, the wafer W under processing has certain real values of the above parameters, which values may not match the expected ones, owing to the incoming substrate, PR materials and coating tools variations. The measuring tool 14 together with) the processor 16 serve for a real time dose correction $\Delta d$ to be made to the exposure dose $d_0$ of the exposure tool 3 so as to obtain the desired PR layer parameters, when applied to the real wafer under processing. This real time correction is implemented with the tool 14 before the exposure procedure within the tool 3, presenting thereby a forward control of the exposure process.

The Apparatus

Figure 3:
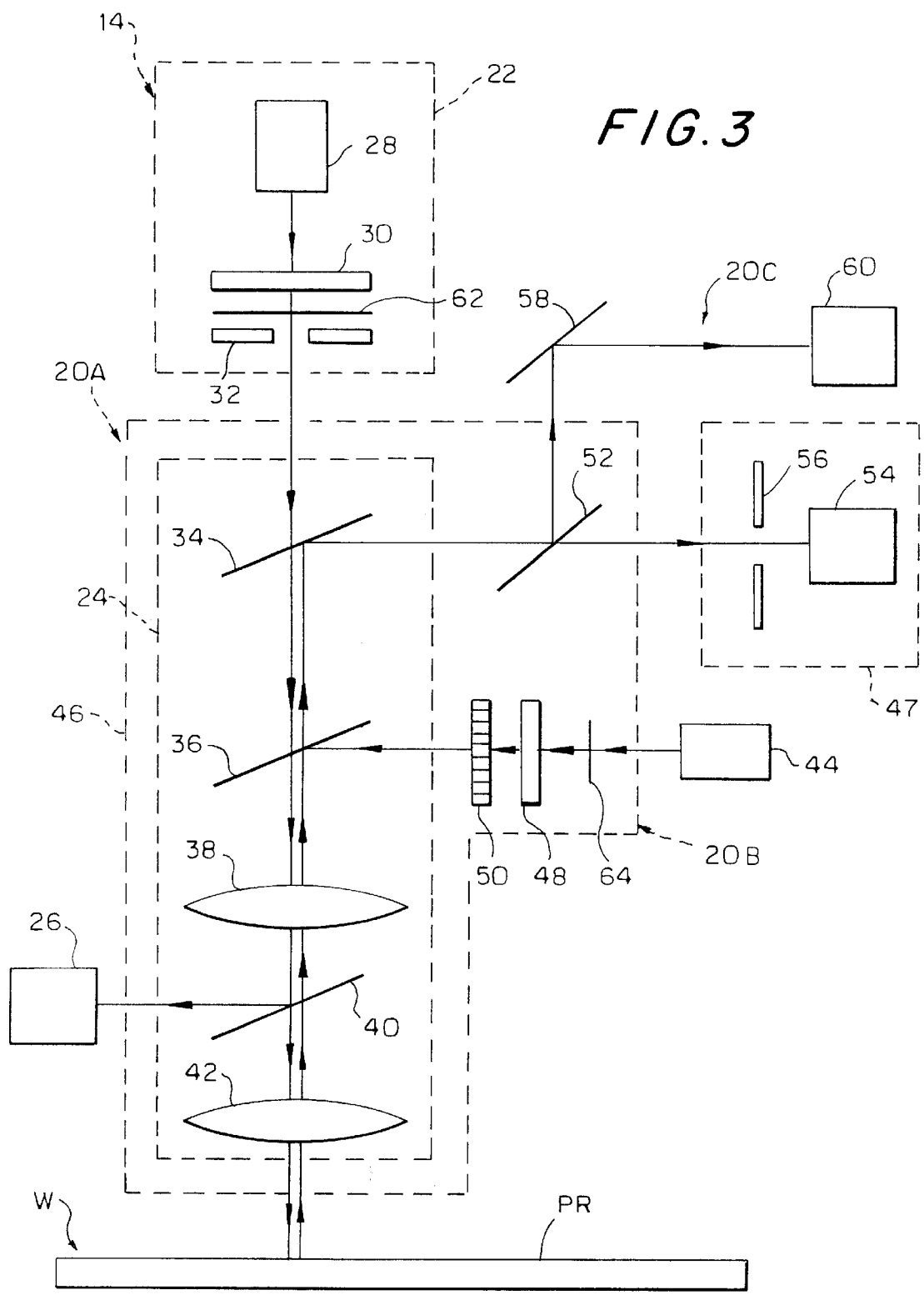
FIG. 3 schematically illustrates the main components of a measuring tool suitable for the system of either of FIG. 2a or FIG. 2b.

Turning now to FIG. 3, the main components of the measuring tool 14 are more specifically illustrated. The tool 14 is associated with a wafer W progressing along the system 10 to be processed by the exposure tool. The wafer W is located on a stage, which is not specifically shown here, to progressively support the wafer during the measurement. The tool 14 comprises three operational channels, generally at 20a, 20b and 20c, serving, respectively, for exposure, measurement and image acquisition. The measurement channel 20b is a spectrophotometer determining the optical parameters and thickness of the PR layer on the wafer W. Generally, the spectrophotometric and imaging channels 20b and 20c may be of any known kind, for example such as that disclosed in U.S. Pat. No. 5,517,312 assigned to the assignee of the present application.

The exposure channel 20a is composed of an illumination unit 22, a light directing unit 24 and a detector unit 26. The illumination unit 22 typically includes a light source 28 for generating UV incident radiation, a monochromatic filter 30 and a pinhole 32. The exposure procedure with the channel 20a utilizes the same wavelength $\lambda_0$ as the exposure tool 3. For that reason, the monochromatic filter 30 is appropriately provided. The light directing unit 24 includes beam splitters 34 and 36, a tube lens 38, a beam splitter 40 and an objective lens 42. The latter is driven by a suitable motor, which is not specifically shown, for auto-focusing purposes in a conventional manner. The beam splitter 40 deflects the part of incident radiation to the detector 26 and the other part to the objective lens 42 to be focused onto the wafer W (i.e. its uppermost PR layer). The operational principles of all these optical elements are known per se.

The measurement channel 20b comprises a light source 44 generating incident light, an optical arrangement 46 and a detector unit 47. It should be noted that the light source 44 may be an external radiation source with respect to the entire tool 14, provided the source 44 is associated with a suitable light directing optics for directing light into the tool 14. The optical arrangement 46 operates in both the pattern recognition and measurement modes. The optical arrangement 46 includes a filter 48, a grid array 50, the light directing unit 24, and an additional beam splitter 52. The filter 48 is designed to cut off the UV radiation, and is appropriately driven by an actuator (not shown) to be displaceable between its operational and non-operational positions, being, respectively in and out of the optical path of light passing through the channel 20b. The operational and non-operational positions of the filter 48 correspond to the pattern recognition and measurement modes of the optical arrangement 46, respectively. The detector unit 47 comprises a spectrophotometer sensor 54 and a pinhole 56. The grid array 50 typically facilitates the image focusing. The pinhole 56 is typically employed for eliminating the exposure area edge effects. It should be noted that the objective lens 42, together with the beam splitter 40 and detector unit 26, are preferably mounted on a movable optical head (not shown) for movement along the X, Y, Z axes. In this case, light beams are directed to and from the optical head by means of additional mirrors. This technique is disclosed in the above indicated U.S. Pat. No. 5,517,312.

The imaging channel 20c is formed by the path of the spectrophotometer channel between the wafer W and the splitting mirror 52, and by an optical mirror 58 and a CCD camera 60. The CCD camera 60 receives the fall image including the projected grids for autofocusing purposes.

Further provided are shutters 62 and 64 (constituting an actuator) installed, respectively. in the exposure channel 20a and measuring channel 20b. The shutters so provided allow for selectively actuating eider the exposure or measurement channel. Consequently, the imaging channel 20c is involved, once the measurement channel 20b is actuated.

The Measuring Tool Operation

The main mode of the tool operation includes the first spectrophotometric measurement of a predetermined site of the PR layer, probe exposure of that site with a dose and wavelength equivalent to the exposure tool dose and wavelength the second spectrophotometric measurement of the same site, and then the calculation of the exposure dose correction.

Probe Exposure

The exposure channel 20a performs a probe exposure procedure, which is generally similar to that of the exposure tool 3 using the same wavelength $\lambda_0$. The probe exposure, however, is carried out on test sites (not shown) typically located outside the patterned area (die area) of the wafer W, for example within a scribe line, and uses a certain predetermined exposure dose $d_i$ equivalent to the nominal (known) dose $d_0$ of the exposure tool 3.

The probe exposure dose $d_i$ does not have to be the exact nominal exposure tool dose $d_0$ for certain mask or product, but the ratio between them should be set. This is implemented either by carrying out a correlation to CD results for the first time, or by using a known data on the nominal exposure. Thus, the measuring tool 14 uses the proportionality ratio between the probe exposure dose $d_i$ and the exposure tool dose $d_0$ to determine the exact correction $\Delta d$ to be applied to the exposure tool dose $d_0$ for proper exposure of the real wafer under processing.

The test site should be a clear area similar to that in the die area that has the same stack of the resist and the underlying layers. The site area must be inside a clear mask area of a mask used in the exposure tool 3. Practically, the wafer area of about 50×50 micron satisfies the mask-related and signal-to-noise requirements.

Spectral Reflectance Measurement

During the operation of the channel 20b, the incident light passes through the light directing optics 46 and impinges onto the wafer W, producing reflected light that propagates in a backward direction through the light directing optics 24 up to the beam splitter 34. Light propagation is shown here schematically so as to facilitate the illustration of the main components and operational principles of the measuring unit 14. The latter directs the reflected light towards the detector unit 47. The beam splitter 52 transmits the pat of the reflected light to the spectrophotometric sensor 54, and reflects the other part of the reflected light to the imaging channel 20c. The operation of the spectrophotometric channel 20b is aimed at determining the optical parameters (absorption coefficient k and refraction index n), substrate reflectivity $R_{sub}$ and thickness h of the PR layer on the wafer W. The spectrophotometric sensor 54 receives the light reflected from the PR layer and generates measured data representative thereof. The measured data is in the form of the substrate or/and PR reflectivity $I_m$ as a function of the light wavelength $\lambda$, i.e. $I_m(\lambda)$.

Measured Data Analysis

The processor 16 is responsive to the measured data $I_m(\lambda)$ for calculating the above parameters $R_{sub}$, k, n and h. To this end, the processor 16 is preprogrammed for running a predetermined optical model (constituting reference data) based on the nominal values of certain optical model factors. These factors are defined by known physical laws describing the light reflection from a multi-layer stack of a kind similar to the stack under processing, and, optionally, the kinetics of a photo-active compound (PAC) when exposed to UV radiation. The spectrum analysis procedure will be described in more detail further below.

The exposure of a PR to UV light results in chemical changes (e.g., different solubility) and variation of the optical properties of the PR, namely its absorption and refraction. PR materials are typically characterized by bleaching effect which is a major factor affecting the optical absorption. The kinetics of PAC exposure is typically defined by Lambert's law of absorption coupled with Beer's law. This technique uses three photoresist parameters ABC (or Dill parameters), wherein A and B are the bleachable and nonbleachable absorption coefficients, respectively, and C is the standard exposure rate constant. Dill parameters play an important role in the CD evaluation and simulation of the lithography process, and can be determined by utilizing known offline and inconvenient technique for measuring a transmitted intensity of a resist through a photoresist and quartz substrate covered with anti-reflection coating (ARC) on its back side. In the optical model of the reflection from a multi-layer stack (i.e. wafer) Dill mathematical equations could be used, being based on theoretical data representative of the PR reflectivity as a function of wavelength, $I_{th}(\lambda)$ Since Dill parameters describe the exposure effect of PR chemical and optical properties, these mathematical equations could be used to understand the reflectivity from the PR layer at each dose level.

According to the present invention, there is no need for prior knowledge of the ABC parameters of the PR. One of the preferred embodiments of the invention presents the calculation of these parameters in a fast and accurate way from calibration curves, when applying the values of exposure time and determining measured data of the PR reflectivity as a function of wavelength $I_m(\lambda)$. Then, the kinetics of the PAC exposed to UV radiation can be accurately described. The optical model using corrected (updated) PR parameters could be calculated, and Dill parameters ABC could be updated. This technique can also serve for optimizing the optical model for PR characterization in a fast and in-line mode. Once the corrected ABC are determined, a routine test of matching the calculated theoretical data $I_{th}(\lambda)$ to the measured data $I_m(\lambda)$ could be presented as an additional characteristic for each measurement. What can actually be retrieved from a calibration curve, is an empiric technique to obtain the exact optical parameter response to the dose radiation. Hence, the dose control via the optical parameter response can be directly carried out.

To achieve accurate exposure and to ensure that the repeatable dose can be given to the resist, a good auto-focusing mechanism should be integrated into the system 10. The requirements for focus precision should be better then the depth of focus of the lithographic process being used. This means that, for today's state of the art applications, a focus precision level of less than 1 $\mu$m is needed. For a focus target any high contrast pattern can be used, as long as this target is close to the exposure location and smaller then the field of view. The auto-focusing method itself may employ any suitable known technique, for example that disclosed in the above U.S. Pat. No. 5,604,344.

Calibration Procedure

General

The measurement unit 14 operates in the following manner. A first operational stage of the unit 14 consists of the creation of a database for the specific PR layer, which is to be currently exposed. More specifically, the previously provided optical model is optimized and calibration curves (constituting reference data) are prepared based on the real PR material, substrate reflectivity $R_{sub}$ and nominal thickness. It is assumed that the effect of a possible change in the nominal values of h and $R_{sub}$ is supposed to be small so as not to cause substantial changes in the calibration curve.

Figure 4A:
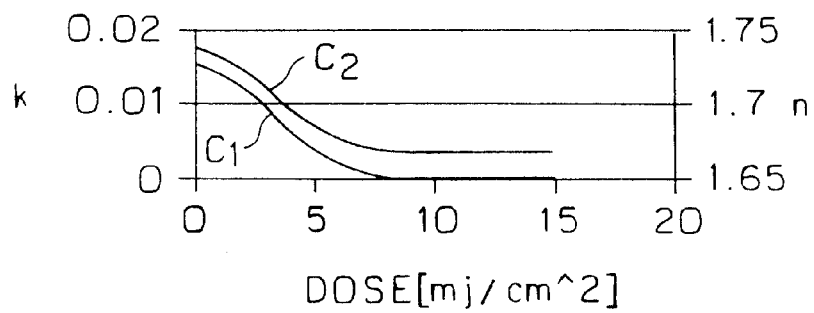
FIGS. 4a and 4b graphically illustrate calibration curves that could be obtained with the measuring tool of FIG. 3.
Figure 4B:
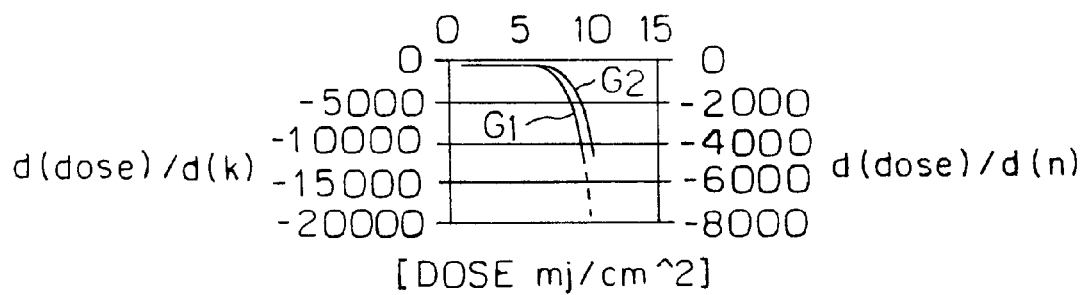

The calibration curves present the probe exposure dose variations affecting the optical parameters k and n. FIGS. 4a and 4b illustrate four graphs $C_1$ and $C_2$, and $G_1$ and $G_2$ representing, respectively, the PR optical parameters as functions of the exposure dose, i.e. $k(d_i)$ and $n(d_i)$, and the exposure dose changes with the changes of the optical parameters as functions of dose, i.e. $\partial d/\partial k(d)$ and $\partial d/\partial n(d)$.

If changes in thickness and substrate reflectivity are detected (i.e. measured), one can calculate the compensation that is needed for the exposure dose by using the ratio of the reflection with the current values of thickness and substrate reflectivity to the known reflection from the nominal values of thickness and substrate reflectivity.

Calibration Curves Determination

Figure 5:
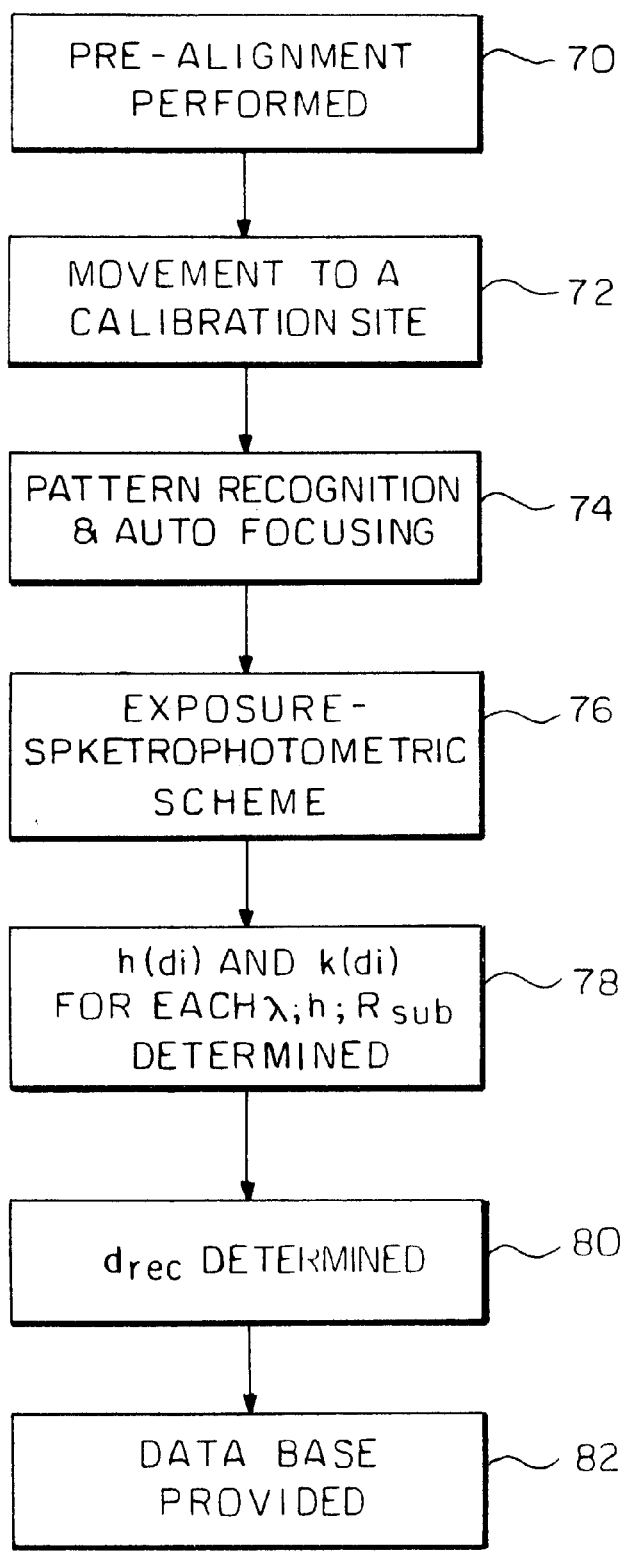
FIG. 5 shows a flow diagram of a method for obtaining the calibration curves of FIGS. 4a and 4b.

FIG. 5 illustrates the main steps of the first operational stage, i.e. set-up operations. Initially, a so-called "pre-alignment" (or registration) procedure is performed in a conventional manner being applied to a first coming wafer from the wafer stack to be processed, i.e. a pilot wafer (step 70). lien, the pilot wafer (or corresponding optics of the measurement channel 20b) is moved to a predetermined test site position, so-called "calibration site" (step 72). Here, the site pattern recognition and auto-focus correction procedures are implemented with the imaging channel 20c (step 74). For the purpose, the shutters 62 and 64 are in their non-operative and operative positions, respectively, so as to block the exposure channel 20a and actuate the measurement channel 20b. As to the filter 48, it is in its operational position, namely in the optical path of light propagating through the channel 20b. Thereafter, a certain exposure-spectrophotometric scheme is applied (step 76). This procedure consists of the following.

The filter 48 is shifted into its non-operational position, being out of the optical path of light passing through the channel 20b. In other words. the channel 20b is switched to the measurement inode. The PR reflectivity as a function of wavelength, i.e. $I_m(\lambda)$, is measured and optical parameters $R_{sub}(\lambda)$, $n(\lambda)$, $k(\lambda)$ and thickness h of the PR layer are calculated, using the optical model optionally based on the nominal values of Dill parameters. Then, the shutters 62 and 64, respectively, open and close the exposure and measurement channels 20a and 20b, and the probe exposure is applied using a predetermined exposure dose $d_i$ proportional to the exposure tool nominal dose $d_0$. Thereafter, the shutters 62 and 64 are operated to. respectively, block die exposure channel 20a and actuate the measurement channel 20b, and "after-exposure" measurement is carried out to obtain measured data $I'_m(\lambda)$ and to calculate the parameters $k'_i(\lambda)$, $n'_i(\lambda)$, thickness $h'_i$ and reflectivity $R'_{sub}$. The "calibration site" actually comprises an array of m test sites, By movements (which are optionally small) from site to site within this array and executing the above scheme at m different exposure doses. the calibration curves k(d) and n(d) are obtained (step 78). From the calibration curves, a recommended exposure dose $d_{rec}$ is determined (step 80). The recommended dose $d_{rec}$ is a dose value at which each of the calculated parameters k, n, $R_{sub}$ and h is equivalent to a corresponding one of the desired parameters to be obtained by the exposure procedure with the exposure tool 3. Thus, the data base associated with this specific PR coating is provided (step 82). This data base comprises the PR optical parameters and thickness as functions of dose (i.e. k(d); n(d); h(d)) with respect to a certain substrate reflectivity $R_{sub}$. It should be noted that, if a certain nominal dose is given by end user, and the above steps associated with the determination of the recommended dose could be eliminated. In this case, the nominal dose value serves as tile recommended dose to be analyzed through measurements and corrected, if required.

At this stage, namely for this recommended dose value $d_{rec}$ of the exposure tool 3, the optical model could be optimized by performing a fitting procedure between the measured data $I'_m(\lambda)$ and the corresponding theoretical data $I_{th}(\lambda)$. As indicated above, the theoretical data is obtained using certain optical model factors. These factors are adjustable to satisfy a certain condition, which is typically in. the form of a merit function defining a so-called "goodness of fit" between the measured data and theoretical data.

Measurement Procedure and Exposure Control

Figure 6:
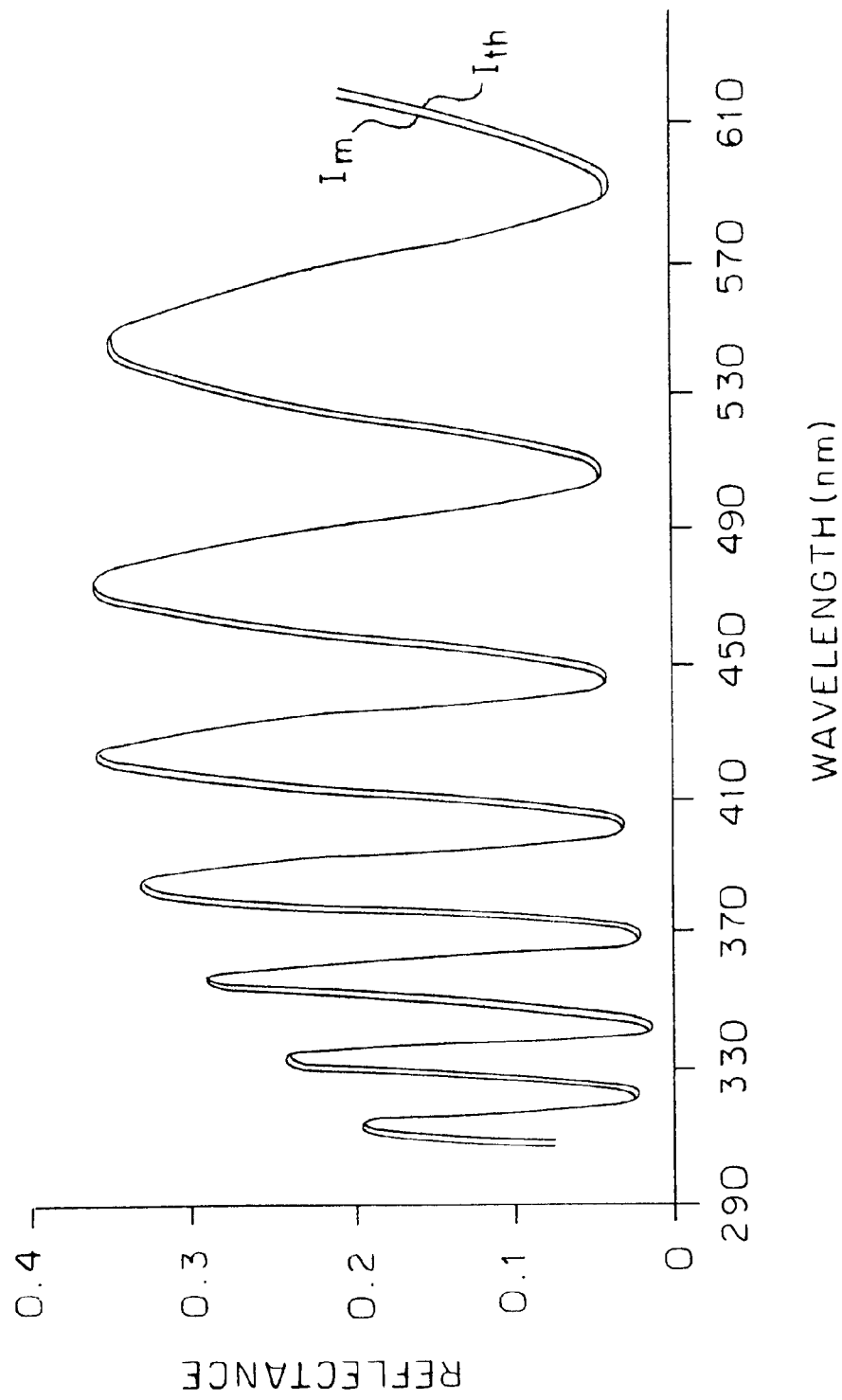
FIG. 6 graphically illustrates the main principles of a fitting procedure in the method of FIGS. 5a–5c.

The measurement procedure consists of the determination of all the parameters affecting the exposure dose, namely: the substrate reflectance, PR thickness and PR optical parameters. FIG. 6 illustrates two graphs $I_m$ and $I_{th}$ representing the PR reflectivity as a function of wavelength, obtained through the measurement and optical model, respectively. By varying (fitting) the values of PR parameters h, n, k and $R_{sub}$, the sufficient goodness of fit could be obtained. By doing this, the optical model factors are updated and the optical model optimized.

Measurement Procedure and Exposure Control

The substrate reflectance contribution to the exposure dose could be calculated by two basic techniques:

(1) an additional measurement of the site before the PR coating, by the spectrophotomretric channel;

(2) concurrently calculating the substrate reflectivity $R_{sub}$ and PR parameters from the measured data $I_m$.

In both cases, the effect of substrate reflectivity fluctuation from the nominal reflectivity value can be deduced and taken into consideration.

Figure 7:
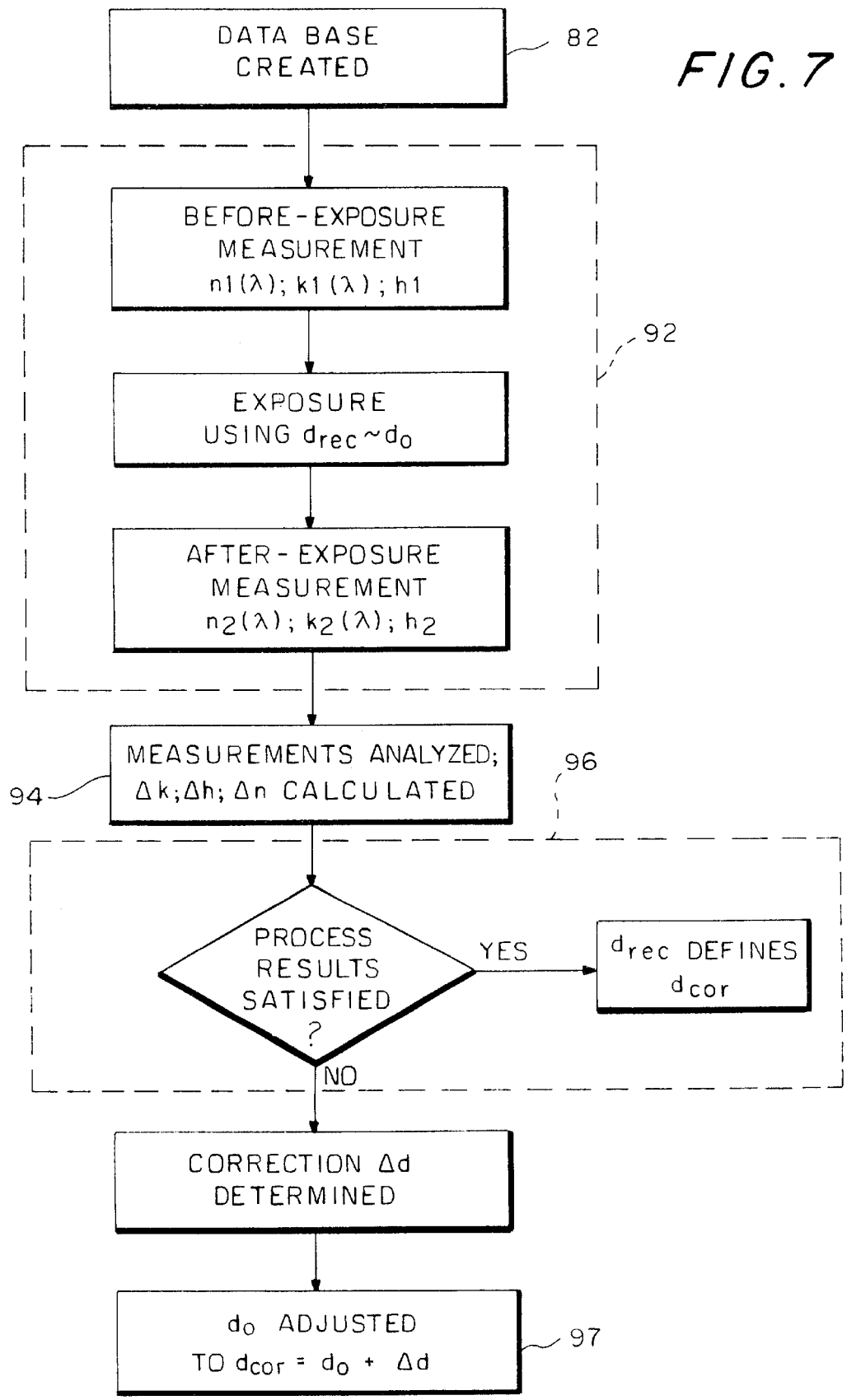
FIG. 7 shows a flow diagram of a dose correction method according to one embodiment of the invention.

If the calculation show that the recommended dose value does not provide the process results, i.e. the desired values of the PR parameters, the operation is moved to a further test site, so-called "measurement site", and a further operational stage is carried out for determining the correction which is to be applied to the recommended exposure dose $d_{rec}$. The main steps of this operational stage are illustrated in a self-explanatory manner in FIG. 7.

As described above, the set-up operations result in the provision of a database associated with this specific PR coating is provided (step 82). Thereafter, the measure-exposure-measure scheme is performed one time using the recommended exposure dose $d_{rec}$ and the exposure tool wavelength $\lambda_0$ (step 92). Each of the before-exposure PR parameters $k_1(\lambda)$, $n_1(\lambda)$, $h_1$ and after-exposure PR parameters $k_2(\lambda)$, $n_2(\lambda)$, $h_2$ is separately obtained. The corresponding parameters and compared, so as to determine the differences between them, that is $\Delta k$, $\Delta n$ and $\Delta h$ (step 94). This enables to detect whether or not the recommended exposure dose $d_{rec}$ needs to be corrected (step 96). If so, the corrected exposure dose $d_{cor}$ is calculated in the following manner:

$$d_{cor}=d_{rec}+\Delta d$$

Here, $\Delta d$ is a function of $\Delta h$, $\Delta k$, $\Delta n$, $\delta R_{sub}$, that is $\Delta d=f(\Delta k, \Delta n, \Delta h, \delta R_{sub})$ or, more specifically:

$$\Delta d = (k_c - k_m) \cdot \left(\frac{\partial d}{\partial k}\right)_c + \varepsilon_{R_{sub}}$$

wherein $k_c$ and $k_m$ are the values of the absorption coefficient obtained from the calibration curse and through measurement, respectively; $(\partial d/\partial k)_c$ is a slope value corresponding to the dose for the "calibration" absorption coefficient; $\varepsilon_{R_{sub}}$ is the dose change due to the absolute reflectivity level of the substrate, including all the layers in the stack, at the exposure wavelength. When the ratio $\delta R_{sub}/R_{sub}$ satisfies the following condition:

$$\frac{\delta R_{sub}}{R_{sub}} \ll 1$$

then for the dose change we have:

$$\varepsilon \approx -\alpha \cdot \delta R_{sub}$$

wherein $\alpha$–Const for a certain PR

It should be noted that the measurement (second) stage could include more than one measurement-exposure-measurement cycle. In other words, the predetermined parameters could be retrieved by applying more then one partial dose, rather than one nominal dose.

To more clearly illustrate the above-described unique features of the present invention, let us consider the following example for the exposure control.

EXAMPLE

In this example, $\delta R=0$, $\Delta h=0$. Turning back to FIGS. 4a and 4b, the calibration curves are obtained. In other words, the relevant data base is already created as described above. The recommended exposure dose is as follows:

$$d_{rec}=4 \text{ mJ/cm}^2$$

The calibration curves $C_1$ and $G_1$ show that for this dose value we have:

$$=k_c=0.006417; (\partial d/\partial k)_c=-375.37$$

Considering the typical case that a dose correction is needed, the second operational stage is performed i.e. the exposure with the recommended exposure dose is applied to the measurement site, and the measured (calculated) data for the absorption coefficient is determined to be:

$$k_m=0.005636$$

As seen in the calibration curves $C_1$ and $G_1$, for the measured value $k_m$ of the absorption coefficient, we have:

$$d_m \approx 4.5 \text{ mJ/cm}^2 \ (\partial d/\partial k)_m = -393.3$$

Using the above equation for the corrected dose value, we have:

$$\Delta d = \frac{1}{2}(0.006417-0.005636) \cdot (-375.37-393.3) \ \Delta d=(-0.3)\text{mJ/cm}^2$$

Hence, in order to obtain the desired value of the PR bleaching, the exposure dose of the exposure tool 3 should be decreased by 7.5%. In this specific example, the complete sequence of dose correction is implemented with respect to k-calibration curves. The similar procedure may be done for the n-calibration curves.

Process Control Applications

The processor 16 determines the correction value $\Delta d$ and generates data representative thereof. This data is transmitted to the respective utility of the exposure tool 3 either directly or through a special host facility (not shown). This technique actually represents the correction signal detection and "feed forward" to the exposure tool 3.

It should be specifically noted that the above-described scheme of a fast accurate and automatic measurements aimed at determining the proper dose for exposure tool 3 can be applied also to different kinds of features like test structures, patterns and specially designed marks on the wafer.

Additionally, the above-described method of fast, accurate and automatic measurement could be used for the entire process control. Indeed, the method allows for comparing and estimating the parameters of any radiation-sensitive material, including liquid and solid ARC, on any substrate. The measurement could be performed across the wafer, in a wafer to wafer, lot to lot or batch to batch fashion. The measuring unit 14 could be installed as a part of any photolithography tools arrangement, such as "link" or "cluster". By means of the above-described operation applied to each wafer, the trend between wafer to wafer could be determined to give feedback corrections to the amount of exposure that is needed to overcome any fluctuations which have a "pre-exposure origin", for example PR photosensitivity. It is known that finally obtained CD may be compensated by various parameters. In this connection, the variability of the parameters k, n, and h, that will be found during the measurements, can be compensated by these parameters. Several feedback options can be done for closing the loop and correcting for the variability of k, n, h or $R_{sub}$ parameters of PR.

The provision of the measuring tool 14 enables to obtain such data whose processing allows for establishing an in-line or offline closed loop control for coating parameters, such as spin speed, humidity, temperature, exhaust, etc. Additionally, the measuring tool could be employed for in-line or off-line closed loop control of the developing process parameters, for example the develop time, post exposure bake (PEB) time, PEB temperature.

It should also be noted, that the calibration curves so obtained provide for the fast, accurate and automatic in-line determination of the ABC parameters (i.e. Dill parameters). Indeed, by a series of partial. exposures the total PR bleaching can be achieved. From the fitting to the initial "before-exposure" reflectivity spectrum and from the fitting to the final reflectivity spectrum the initial absorption and final absorption could be determined, the difference between them representing the first Dill parameter A.

The above-described technique enables the exposure dose for any location on the wafer to be in-line predicted, using the in-line determination of ABC parameters. This allows for predicting the CD values and for in-line simulation using the actual values for $R_{sub}$ ABC, n, k, and h parameters, which is advantageous, as compared to any off-line simulation.

Figure 8A:
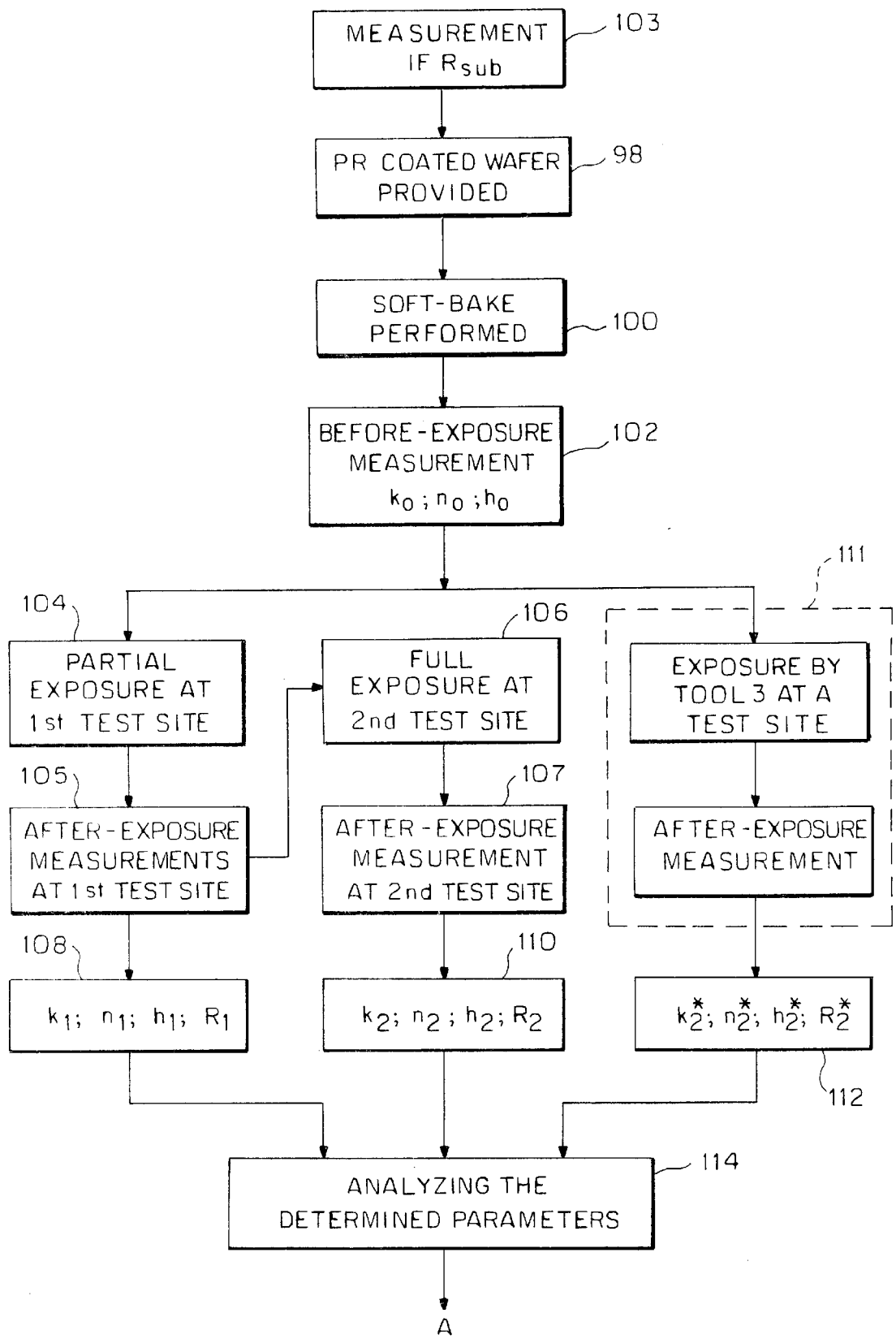
FIGS. 8a–8b illustrate flow diagrams of a dose correction method according to some embodiments of the invention.
Figure 8B:
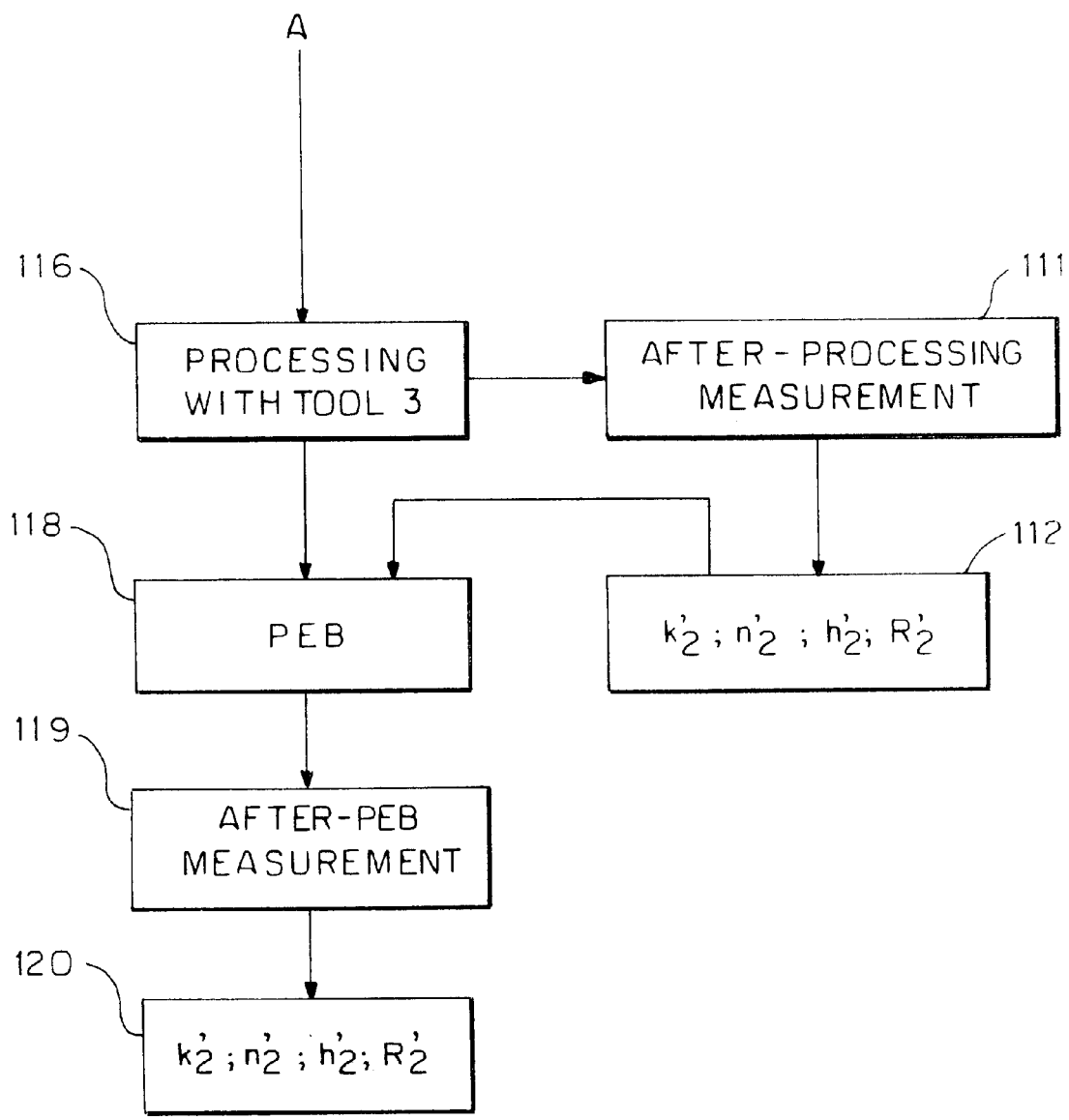

Reference is now made to FIGS. 8a–8b illustrating flow diagrams of some other embodiments of the process control procedures. These procedures differ from each other by the process stage at which measurement is conducted.

Before Coating Measurement

The substrate reflectivity $R_{sub}$ is measured prior to the coating procedure (step 103). The measured reflectivity could be used for partial control of the exposure dose or for minimizing the freedom degrees of further optimization, as will be described below.

Measurement-Exposure-Measurement

A wafer, after the PR coating (step 98) and soft-bake processes (step 100) applied thereto, undergoes the measurement of the relevant parameters: $k_0$, $n_0$ and $h_0$ (step 102). Then, the above exposure-measurement scheme is applied either to the first site only using the partial exposure dose (steps 104 and 105) or to the second test site using the full exposure dose (steps 106 and 107). After-exposure values of these parameters are determined, that is $k_1$, $n_1$, $h_1$, $R_1$ and $k_2$, $n_2$, $h_2$, $R_2$ (steps 108 and 110). By analyzing the "before-exposure" and "after-exposure" measurements (step 114), the exposure dose of the exposure tool 3 may be adjusted.

Calibration of the Measurement and Exposure Tools

A similar full exposure may be applied to a test site by the exposure tool 3 (step 111) for determining after-exposure values of the relevant parameters $k^*_2$, $n^*_2$, $h^*_2$, $R^*_2$ (step 112). Steps 106, 107, 110 could be applied for determining $k_2$, $n_2$, $h_2$, $R_2$. The obtained results would be compared to the results of the steps 111 and 112. Steps 111 and 112 present the similar full exposure that can be applied to the test site by the exposure tool 3 for determining after-exposure values of the relevant parameters $k^*_2$, $n^*_2$, $h^*_2$, $R_2$. Comparison between two different full exposure results could serve for matching of the exposure procedures conducted by the exposure tool and the measuring tool.

Thickness Loss Due to the Exposure

By comparing the results of steps 102 and 110, thickness loss due to exposure could be deduced. This could serve for dose control via thickness change during exposure. The aforementioned control will be evaluated from the calibration curve h(d) that could be determined from the calibration procedure.

De-protection Induced Thickness Loss (DITL)

An additional analysis of the two different after-exposure measurements assists in the estimation of a thickness loss of the wafer after the PEB process. Another option shown in FIGS. 8a–8b is that of the wafer being further processed within the exposure tool 3 (step 116), undergoing measurement (steps 111, 112) and undergoing PEB process (step 118). Thereafter, the after-PEB measurement is performed (step 119) and $k'_2$, $n'_2$, $h'_2$, $R'_2$ parameters are determined at the second test site (step 120). The determined values are compared to those obtained from steps 111 and 112. This enables a baseline for "after expose measurements" to be created for the estimation of De-protection Induced Thickness Loss (DITL) in chemically amplified resists.

Procedures Without the Use of Exposure Channel

Figure 9A:
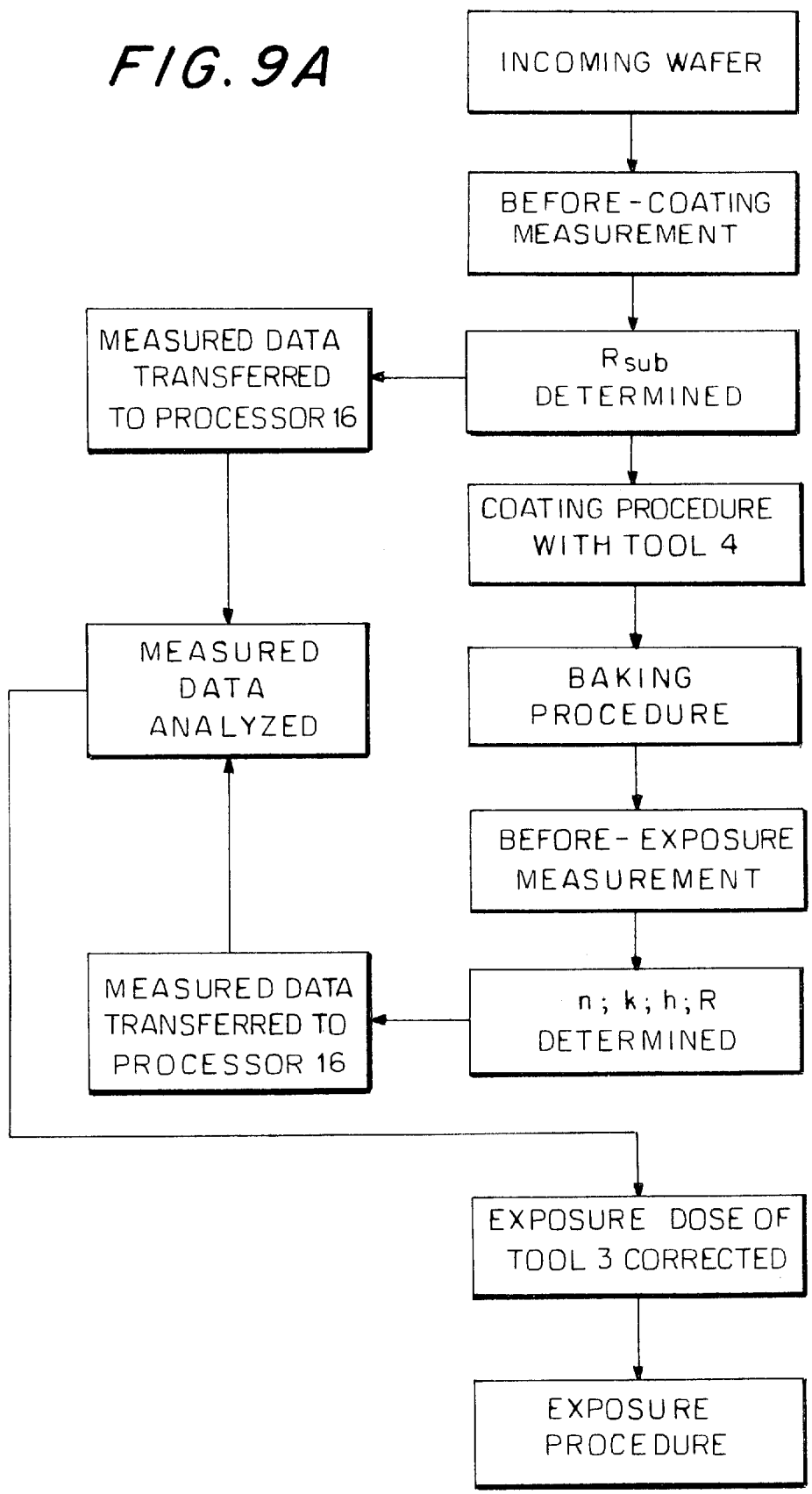
FIGS. 9a and 9b are flow diagrams illustrating the main principles of two more embodiments of the invention, respectively.
Figure 9B:
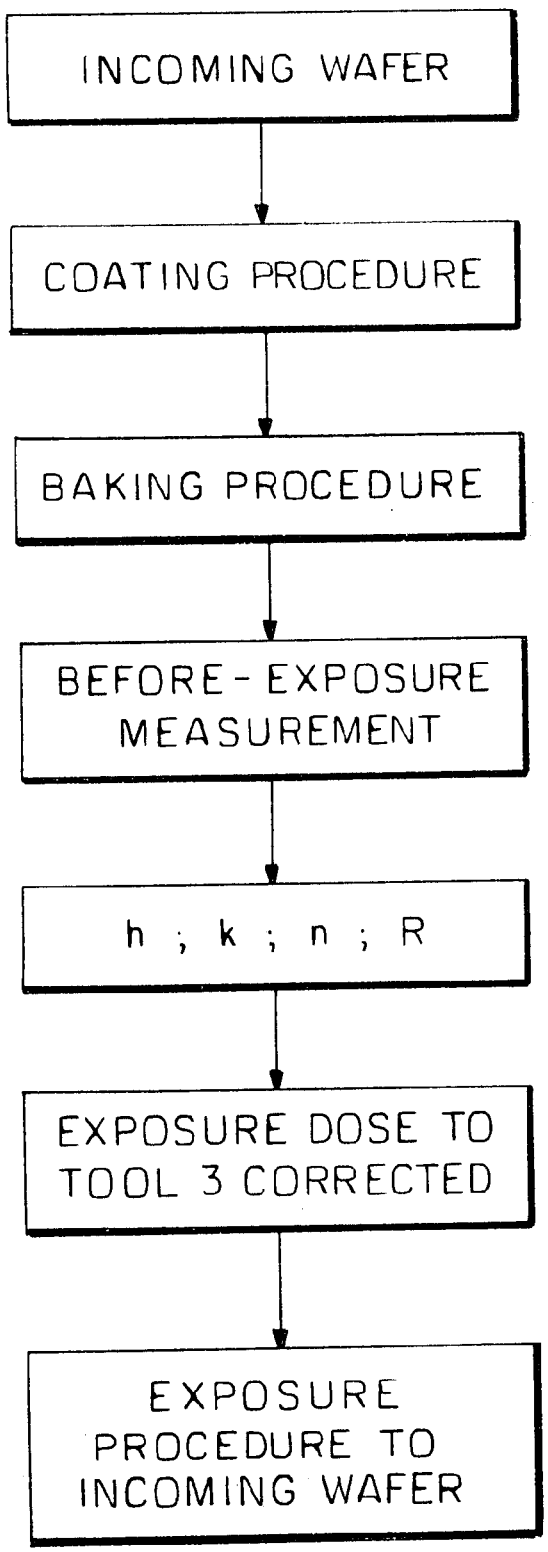

Turning now to FIGS. 9a and 9b, two more examples of a method according to the invention are presented in a self-explanatory manner. According to these examples, the measuring tool 14 does not need any processing (exposure) channel, but operates only for measuring the relevant parameters of the wafer prior to the processing, namely prior to the coating and exposure procedures in the example of FIG. 9a and prior to the exposure procedure only in the example in FIG. 9b. In these cases, the measuring tool may be a spectrophotometer of any suitable kind, capable of providing fast and accurate measurements of the intensity of light returned from an article. For example, the construction and operation of such a spectrophotometer may be similar to that disclosed in U.S. Pat. No. 5,517,312 assigned to the assignee of the present application.

Thus, the present invention enables to obtain data that can be used to initiate a base line for controlling the lithography process affecting thickness changes during the PR exposure or PEB, as a part of more elaborate setup for process control. Data obtained from the above method may be used for the correlation of other metrology tools results, for example construction of a calibration curve between this method to any one of the known metrology tools for measurement of critical dimensions. (e.g. SEMCD, AFM).

In view of the above, the advantages of the present invention are self-evident. It provides a method and apparatus for determining the mid-, near- or deep UV accurate exposure dose of a patterning exposure tool, for every product wafer. The invention allows for automatic, fast and accurate dose controlling of the photolithographic tools in production. To measuring unit 14 so designed enables the integration of a measurement system inside a photolithographic tools arrangement in order to obtain a closed loop feed forward control based on measuring production wafers. The integration of such a tool will enable, among other things, a fast response and comparison for wafer to wafer thickness variations, wafer thickness non-uniformity, reflectance variations in the resist, ARC or layers below them. The invention allows for thickness measurement as a function of time to achieve the control of thickness changes caused by volatile component evaporation or acid loss. The measuring unit 14 may include several metrology operations for monitoring several lithography steps, like exposure and PEB.

The present invention provides a so-called "information baseline for all other process and/or tools variables and can be used for compensating any initial fluctuations. For example, it provides for controlling a photolithography process by analyzing data obtained from measurements of the differences in the optical parameters and thickness between the initial, pre-soft-bake state and final, after-exposure states, the initial, after-exposure and final, after-post-exposure-bake states. The situation of after-expose state can be easily achieved with the systems 10, 100 by applying the full nominal exposure of the exposure tool and after the bake procedure that follows the exposure. The invention also provides a direct method for determination of the Dill parameters without any need for special mask or transparent wafer, or special off-line tests. The present invention can be used each time the correlation of the dose correction to the known metrology tool results is required. The present invention overcomes the difficulties of controlling the exposure step for photolithographic process, without any need for an in situ internal calibration of the exposure tools or previous "off line" measurement of the resist parameters.

Those skilled in the art will readily appreciate that many modifications and changes may be applied to the invention as hereinbefore exemplified without departing from its scope defined in and by the appended claims. For example, the present invention may be used for controlling other parameters of the exposure tool, e.g. the exposure time. Alternatively, the present invention may be used for controlling the operation of other photolithography tools, as well as of any other processing tool for processing workpieces. The processing tool that could be controlled by the invented technique should be characterized by a working parameter whose variations affect the optically measurable parameters of the workpiece. This enables the measuring tool to be installed upstream of the processing tool and provide feed forward loop for correcting the working parameter when required.

What is claimed is:

1. A method for automatic optical control of at least one of exposure and focus parameters of an exposure tool in a photolithography arrangement to be applied to a workpiece coated with a photoresist layer, the method comprising the steps of:
   (a) applying a measuring tool comprising a spectrophotometer to the workpiece prior to processing of the workpiece by the exposure tool;
   (b) measuring at least one parameter of the workpiece and generating measured data representative thereof, said at least one parameter of the workpiece being a parameter defining said at least one of the exposure and focus parameters of the exposure tool to enable obtaining desired parameters of the workpiece by exposing the workpiece with the exposure tool; and
   (c) analyzing said measured data and determining a required value of said at least one of the exposure and focus parameters of the exposure tool to provide said desired parameters of the workpiece resulting from applying the exposure tool to said workpiece;.

2. The method according to claim 1, further comprising the step of:
   providing reference data representative of at least one calibration curve in the form of said at least one parameter of the workpieces as a function of said at least one of the exposure and focus parameters of the exposure tool.

3. The method according to claim 1, and also comprising the step of:
   providing an optical model based on nominal values of certain features of the workpiece for obtaining theoretical data representative of said at least one parameter of the workpiece.

4. The method according to claim 3, and also comprising the step of:
   analyzing said theoretical and measured data and optimizing the optical model by correcting the nominal values of said certain features of the workpiece.

5. The method according to claim 1, wherein at least one of the exposure and focus parameters of the exposure tool is given a preset value prior to processing of the workpiece by the exposure tool, said method further comprising the step of:
   (d) comparing the preset value with the required value and, when the comparison indicates that a difference exists, calculating a correction value and generating data representative of the correction value
   (e) in response to said data representative of the correction value, correcting said preset value of the working parameter of the processing tool to be applied to the measured workpiece.

6. The method according to claim 1, wherein the exposure tool is a part of a production line, said workpiece progressing along the production line towards the exposure tool through said measuring tool.

7. The method according to claim 1, wherein said photolithography tool arrangement further includes a coating tool for processing the workpiece, said method further comprising the step of applying the measuring tool to the workpiece prior to processing of the workpiece by the coating tool.

8. The method according to claim 1, wherein said at least one parameter of the workpiece is an absorption coefficient.

9. The method according to claim 1, wherein said at least one parameter of the workpiece is a refraction index.

10. The method according to claim 1, wherein said at least one parameter of the workpiece is a reflectivity.

11. The method according to claim 1, wherein said at least one working parameter is a thickness of at least an uppermost layer thereof.

12. The method according to claim 1, wherein said workpiece is a semiconductor wafer.

13. A method for automatic optical control of at least one of exposure and focus parameters of an exposure tool in a photolithography tools arrangement to be applied to a working area of a workpiece coated with a photoresist layer for providing a desired value of at least one parameter that the workpiece is to have after having been exposed with the exposure tool, the method comprising the steps of:
   applying a measuring tool comprising a spectrophotometer to the workpiece prior to exposing the workpiece with the exposure tool;
   measuring, with the measuring tool, said at least one parameter of the workpiece and generating measured data representative thereof; said at least one parameter of the workpiece being a parameter defining said at least one of the exposure and focus parameters of the exposure tool should have in order to cause the at least one parameter of the workpiece to be given the desired value after exposing the workpiece with the exposure tool; and analyzing said measured data for determining a required value for said at least one of the exposure and focus parameters of the exposure tool provide the desired value of the at least one parameter of the workpiece after exposing the workpiece with the exposure tool.

14. The method according to claim 13, wherein at least one parameter of the workpiece is a reflectivity.

15. The method according to claim 13, wherein at least one parameter of the workpiece is a refraction index.

16. The method according to claim 13, wherein at least one parameter of the workpiece is an absorption coefficient.

17. The method according to claim 13, wherein said at least one parameter of the workpiece is a thickness of at least an uppermost layer thereof.

18. The method according to claim 13, wherein said workpiece is a semiconductor wafer progressing along a production line.

19. A production line having a photolithography tools arrangement including an exposure tool for processing successive workpieces coated with a photoresist layer and progressing along the production line so as to provide a desired value for at least one parameter of a workpiece after exposing the workpiece with the exposure tool, the production line comprising a measuring tool comprising a spectrophotometer installed so as to be applied to each workpiece prior to the processing thereof by the exposure tool, the measuring tool being operable for measuring said at least one parameter of the workpiece and determining a required value of at least one of exposure and focus parameters of said exposure tool to provide the desired value resulting from exposing the workpiece with the exposure tool, wherein said at least one parameter of the workpiece is a parameter defining the at least one of the exposure and focus parameters of the exposure tool to enable obtaining the desired value for the at least one parameter of a workpiece after exposing the workpiece with the exposure tool.

20. The production line according to claim 19, wherein said successive workpieces are semiconductor wafers.

* * * * *